United States Patent [19]

Deluca et al.

[11] Patent Number: 5,128,830
[45] Date of Patent: Jul. 7, 1992

[54] INTEGRATED INSTALLATION ASSEMBLY WITH SELF ALIGNING CONNECTOR

[75] Inventors: Alfred E. Deluca, Harvard; David T. Symmes, Danvers; Jeffrey M. Lewis, Maynard, all of Mass.

[73] Assignee: Digital Equipment Corporation, Mass.

[21] Appl. No.: 547,739

[22] Filed: Jul. 2, 1990

[51] Int. Cl.$^5$ .............................................. H05K 7/20
[52] U.S. Cl. .................. 361/383; 361/390; 361/399; 361/415
[58] Field of Search .............. 361/383, 384, 390, 391, 361/392, 394, 395, 399, 415

[56] References Cited

U.S. PATENT DOCUMENTS

| | | | |
|---|---|---|---|
| 2,994,807 | 8/1961 | Devine et al. | 361/391 |
| 4,702,535 | 10/1987 | Beun | 361/391 |
| 4,899,254 | 2/1990 | Ferchau et al. | 361/384 |

*Primary Examiner*—Gregory D. Thompson
*Attorney, Agent, or Firm*—William P. Skladony; Ron E. Myrick; Barry N. Young

[57] ABSTRACT

An integrated installation assembly for removably supporting a hardware module within a computer cabinet. The integrated installation assembly comprises a substantially ridgid frame work having interconnected top frame member and bottom frame member which has a back portion. Also included is a cover spaced from the back portion of the bottom frame member. The frame members and the front cover define an interior support space in which a hardware module can be mounted. Shock absorbing means are connected to the framework of the assembly for minimizing the vibration of the hardware module. Ventilation is provided through the front cover and the top and bottom frame member for cooling the hardware module. The front cover also includes control elements for operating the hardware module and status information elements which give operating status information about the hardware module. A self aligning connector capable of multidirectional, planar movement within certain tolerances is included for blind mating the hardware module with the computer cabinet.

50 Claims, 10 Drawing Sheets

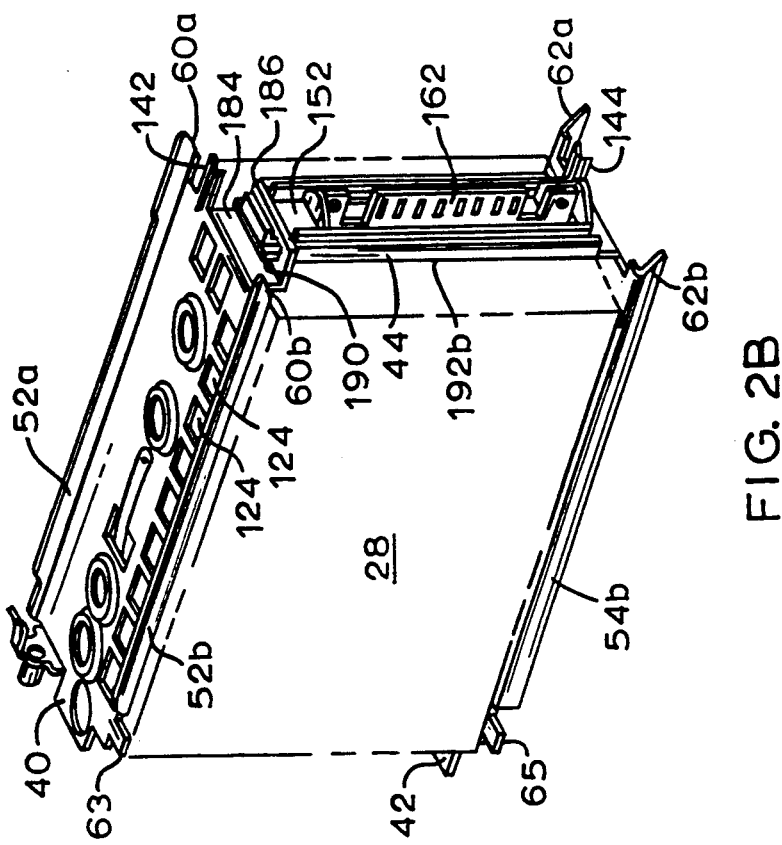
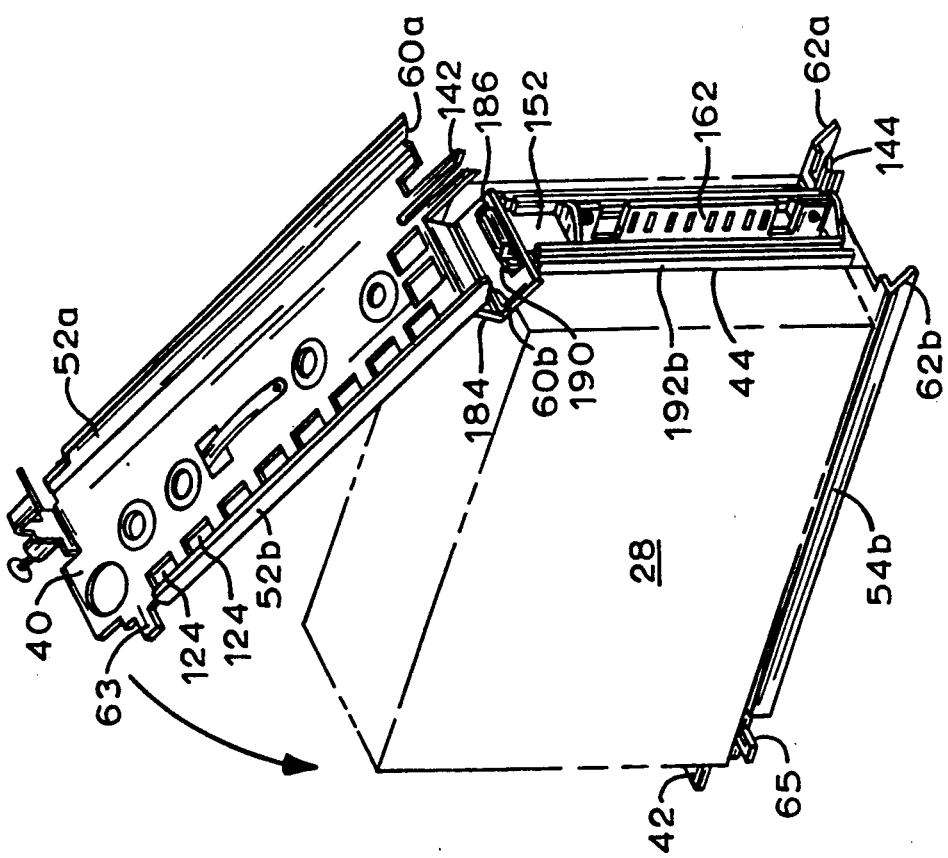
FIG. 2B
FIG. 2A

INTEGRATED INSTALLATION ASSEMBLY WITH SELF ALIGNING CONNECTOR

FIELD OF THE INVENTION

The present invention relates to an assembly for the slideable mounting of a hardware module, such as a storage device or power supply, in a computer cabinet.

BACKGROUND OF THE INVENTION

The mounting of a hardware module through the slidable drawer or rack mounting method is well known in the art. Given that a module must make power and signal connections with the computer cabinet within which it is installed, slidable mounting arrangements frequently employ the blind mating technique. This technique involves the automatic physical coupling of two elements of a connector assembly when the module is installed in the cabinet. This connection is typically made in an interior region of the cabinet, which is usually not easily accessible. One difficulty resulting from the use of the the blind mating technique is assuring that the two mating connector elements are properly aligned so that the connection will be reliably made.

One such blind mating technique is shown in U.S. Pat. No. 4,754,397 issued to Varaiya et al. on Jun. 28, 1988. Here the connection between the module and the housing is made through a connector jack which is fixedly located on the back of the drawer which holds the module, and a connector plug included on the backplane of the housing. The mating of the jack and plug relies upon a machined, precisely aligned opening defined through the right side of an end plate of the drawer, and a second oval alignment opening defined through the left side of the end plate. Tapered alignment pins mounted on the backplane enter these openings and thereby register and align the plug and jack prior to engagement as the drawer is installed. Accordingly, alignment involves the movement and positioning of the back end of the drawer as opposed to the movement and positioning of the jack and plug.

Another example of a blind mating technique is shown in U.S. Pat. No. 4,812,133 issued to Fleak et al. on Mar. 14, 1989. This patent shows the use of a "floating connector", which has at least one of the two parts of the connector free to move, or "float", within a predetermined tolerance. Generally, the alignment of the two connector parts of a floating connector is accomplished by first having some non-electrical, tapered guide pins, posts, or projections on one of the connector parts engage a corresponding non-electrical recess on the other. This cooperative interaction between the non-electrical guide means causes the alignment of the electrical connector elements for later mating as the two connector parts are physically brought together to final mating engagement. The alignment is accomplished by the guide projections and their corresponding recesses, not the electrical contact elements, themselves.

The physical parts which effect the alignment of floating connectors known in the art are typically manufactured as an integral part of the connector casing. As such, these alignment elements and the electrical elements that form the electrical connection, are fixedly bundled together to form an inseparable unit. As a result of this integral relationship the electrical contact elements cannot be easily separated from the alignment elements in the event that it is necessary or desirable to substitute a new electrical contact arrangement in place of the existing one.

In addition, floating connectors known in the art have been used for the purpose of mating a plurality of male and female connector elements, which are not all collinear with each other. In other words, floating connectors have been used with electrical connector elements which are arranged in arrays of generally orderly rows and columns. They have not been used with electrical connector elements which are all arranged linearly, such as the contacts on an edge card or a circuit card.

Separate from the issue of blind mating, when certain hardware modules, storage devices specifically, are mounted with a computer cabinet, other problems have been encountered in the prior art. For example, storage devices are commonly arranged side-by-side within a computer cabinet. Each such storage device is typically connected to a mother board, which may simultaneously control several storage devices. Often the mother board is also mounted beside its related storage devices. The multiple storage devices will each have their own cable connections crossing through the inside of the cabinet to the mother board. This cabling arrangement may impede the flow of a cooling fluid within the cabinet causing uneven, and possibly inadequate, cooling of the system. It also has a further disadvantage in that the control elements necessary for operating and servicing the storage device are contained on the mother board. With this type of arrangement, it may not be easy for a service person to readily identify which control elements and connections relate to a given storage element.

Other arrangements of storage devices within the computer cabinet have placed the control elements together with the storage device; however, the access to those elements typically involves the removal of a panel which forms part of the enclosure in which the storage device is housed. This arrangement thereby limits easy access to the device for control and servicing purposes.

While the prior art shows the slidable mounting of hardware modules generally and further shows the use of floating connectors, a need exists for the combination of an integrated installation assembly, which provides for convenient access to the hardware module for control and service, along with a floating connector in which the flotation means may be easily separated from the electrical connector elements. Moreover, a need further exists for a floating connector in which the electrical connector elements are all linear, as in the case of a circuit card, and in which the electrical elements are substantially self aligning. Finally, a need exists to provide both an integrated installation assembly and a floating connector which are inexpensive, easy to manufacture and assemble, and reliable.

In accordance with an aspect of the present invention, there is provided an integrated installation assembly for the purpose of mounting a hardware module, such as a storage device or a power supply, in a computer cabinet.

Another feature of the invention is to provide an integrated installation assembly which is inexpensive, easy to manufacture and assemble, and reliable.

In another aspect of the invention there is provided an integrated installation assembly with a floating, self aligning, circuit card connector which connectively couples the hardware module with the overall computer in which the hardware module is housed.

In still another aspect of the invention there is provided a floating connector in which the flotation means is not formed as an integral part of the electrical elements of the connector, enabling easy separation of the flotation means from the electrical contact elements.

SUMMARY OF THE INVENTION

In accordance with the present invention, an integrated installation assembly includes a rigid structural frame which is capable of containing and supporting a hardware module. The top and bottom frame members are affixed with a shock absorbing means, such as elastomeric grommets, for the purpose of insulating the hardware module against shock and vibration. The top and bottom frame members further have spaced and parallel rails which slide inside U-shaped, rail channels, which are affixed to the computer cabinet.

Mounted on the rearward side of a back portion of the bottom frame member is a "floating" bracket, which can move from side to side and up and down, within certain tolerances. Fixedly attached to this bracket is a circuit card which is matingly configured so that it can be inserted in a slotted connector which is fixedly mounted on the backplane of the computer cabinet. Accordingly, when the frame members are inserted into the computer cabinet along the U-shaped, rail channels, the bracket on which the circuit card is mounted will float to its proper alignment so that the circuit card engages the backplane connector.

In addition, the assembly further includes ventilation apertures through the frame members and ventilation louvers on a plastic, front cover, all of which assist with the cooling of the hardware module. The front cover further contains control and status elements which are operatively connected to the hardware module and which thereby offer easy access to the hardware module for diagnostic or control purposes.

These and other objects, features, and advantages of the present invention will be further appreciated and better understood upon consideration of the following detailed description of the preferred embodiment, presented in conjunction with the accompanying drawings.

BRIEF DESCRIPTION OF THE DRAWING

FIG. 2A is a perspective view of a hardware module mounted within the rigid, frame members with the floating bracket assembly, showing the method by which the top frame member is connected to the back portion of the bottom frame member and the floating bracket.

FIG. 2B is the same view as FIG. 2A; however, it shows the top frame member in its normal position after being connected to the back portion of the bottom frame member, as suggested by the arrow in FIG. 2A.

DESCRIPTION OF THE PREFERRED EMBODIMENTS

Figure 3:
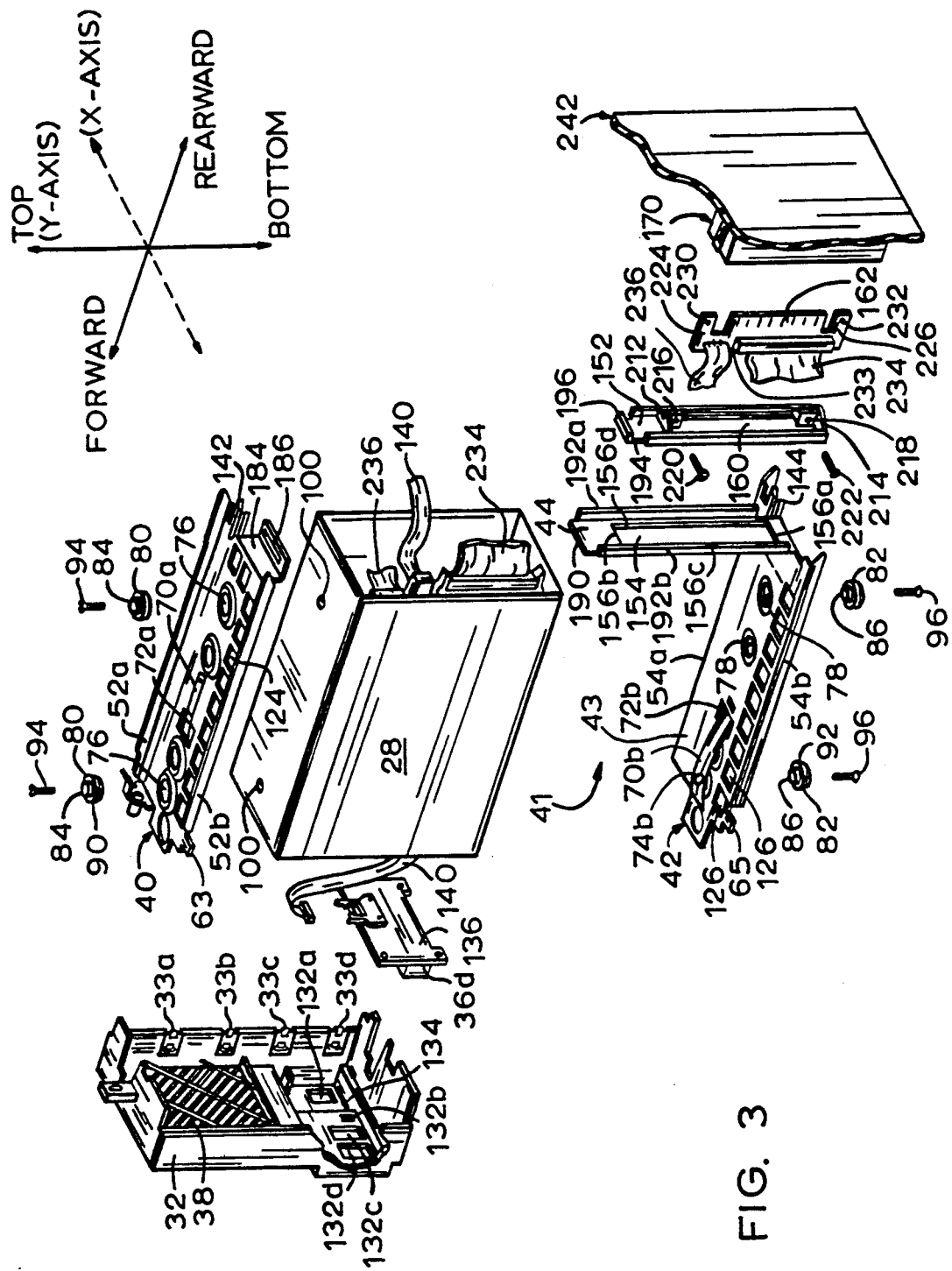
FIG. 3 is a perspective, exploded view of the components of the assembly, including a hardware module positioned between the elements, and a partially broken away, partial cross sectional view of a backplane with a backplane connector mounted thereon.

Reference will now be made in detail to the present preferred embodiments of the invention, examples of which are illustrated in the accompanying drawings. All orientation references, such as top, bottom, foreword, or rearward are based upon the mounting of the assembly within the computer cabinet. FIG. 3 contains an orientation key showing the top and bottom to be determined by reference to the top and bottom of the computer cabinet, and the foreword orientation referring to the end furthest away from the computer's backplane and the rearward orientation referring to the end closest to the backplane. In the preferred embodiment, the hardware module is a storage device, such as a disk or tape drive.

Figure 1:
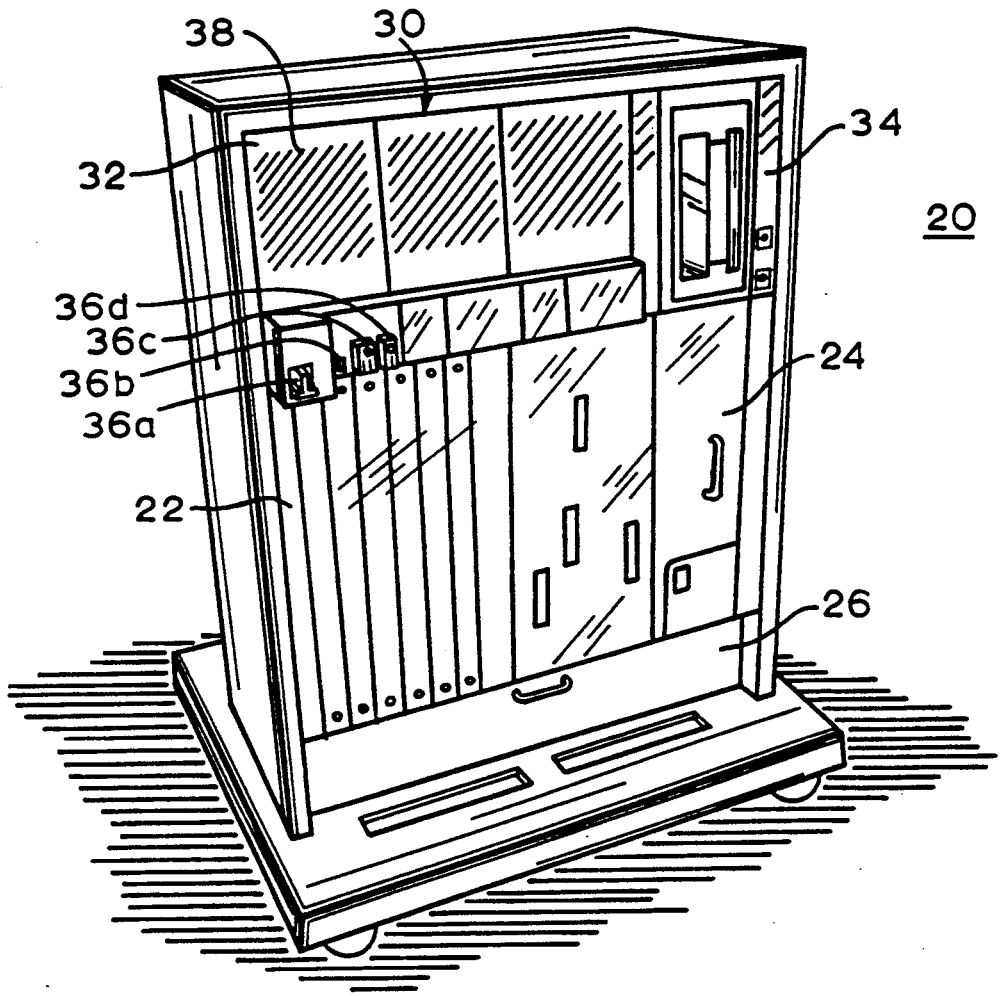
FIG. 1 is a perspective view of a computer cabinet showing in the upper portion four integrated storage assemblies of the present invention mounted side by side, and showing in the lower portion other computer elements which are not part of the invention, but which are typically mounted inside a computer cabinet and shown for reasons of completeness.

Referring to FIG. 1, a computer cabinet, generally designated 20, is shown having a number of system components such as circuit boards, generally designated 22, a power supply 24, and a fan (not shown) mounted in fan tray 26. Mounted in the upper portion of cabinet 20 is a plurality of integrated installation assemblies, generally designated 30, which are positioned side by side. Front covers 32, 34 are pieces of molded plastic which, when installed, have an attractive, finished appearance. Thus, the computer may be operated without a front panel or door, and still have an aesthetic appearance. Cover 32 is the front of assembly 30 which is used for mounting a disk drive, while cover 34 is the front which is used for mounting a tape drive. Covers 32, 34 are shown in greater detail in FIGS. 8 and 9, respectively. Also shown in FIG. 1, cover 32 has control and status elements 36a, 36b, 36c, 36d, which contain light emitting diodes, and ventilation louvers 38.

Computer cabinet 20 may have its own finished front door (not shown), which would have its own ventilation louvers positioned in front of louvers 38 to facilitate the ventilation of a storage device mounted behind covers 32, 34. In addition, the front door may have a transparent window which could be made of smoked glass, positioned in front of control and status elements 36a, 36b, 36c, 36d so that they are visible while the door is shut.

Referring now to FIGS. 2A, 2B and 3, the assembly 30 includes a frame means for forming a substantially rigid framework. As embodied herein, the frame means includes a top frame member 40 and a bottom frame member 42. Bottom frame member 42 includes bottom portion 43 and a back portion 44 integrally formed orthogonally with each other such that bottom frame member is generally L-shaped. When assembled, back portion 44 extends orthogonally from the bottom frame member 42 in the direction of the top frame member 40. The frame members 40, 42 are formed of sheet metal, which may be bent and punched through a fabrication process which makes them economical and easy to manufacture.

Figure 4A:
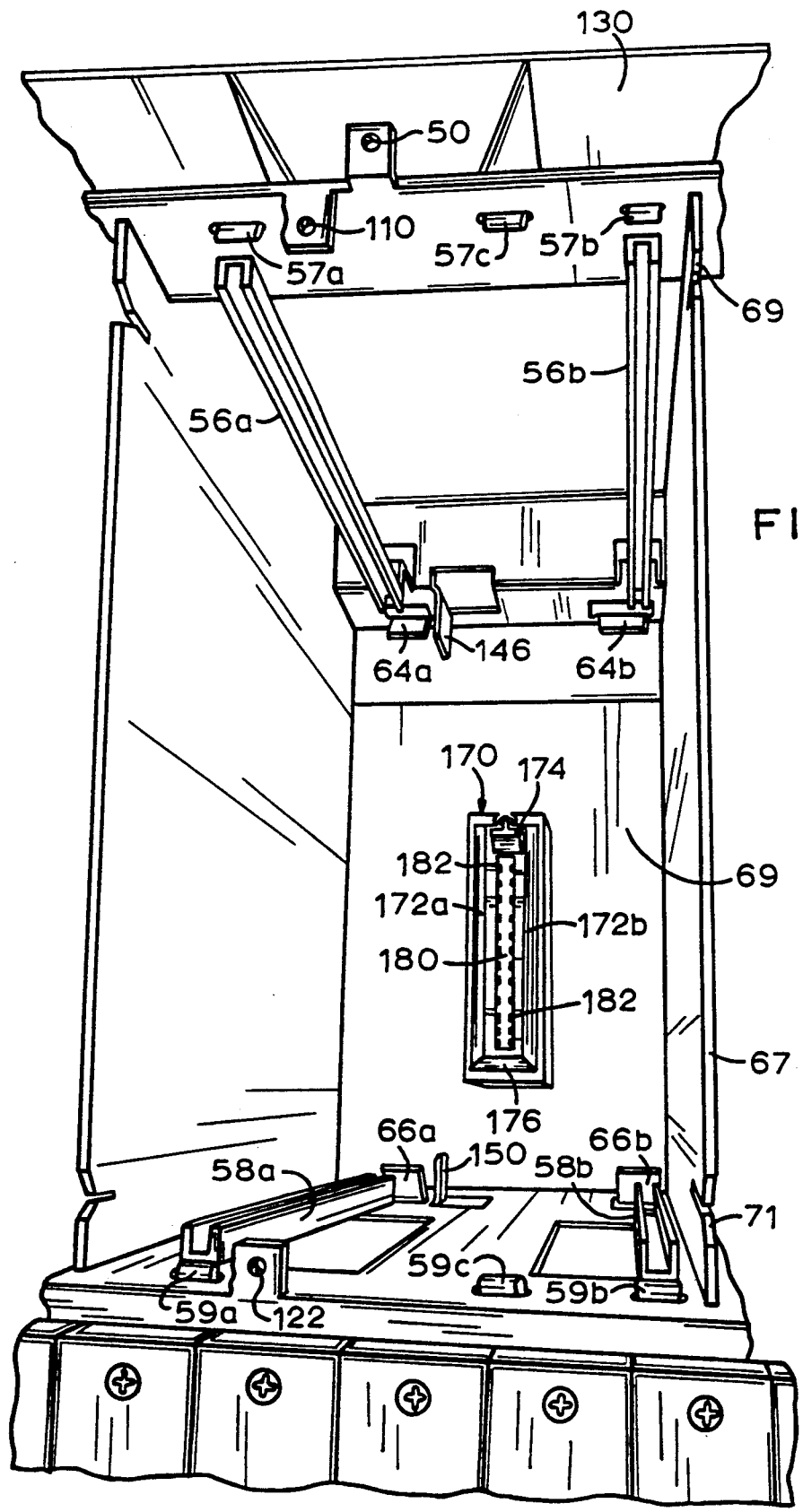
FIG. 4A is a front, perspective view of the cavity in the computer cabinet in which the assembly is mounted.
Figure 8:
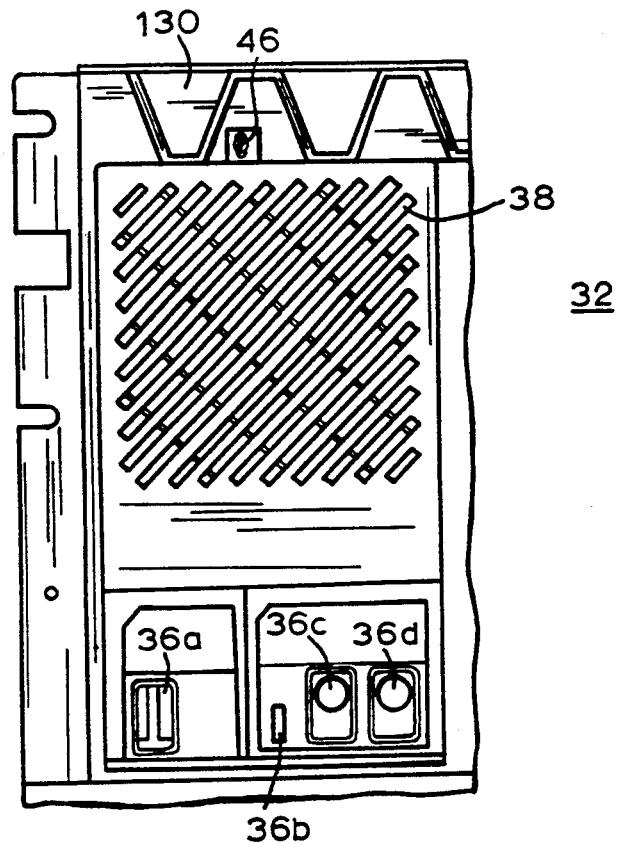
FIG. 8 is a front view of a cover of the assembly which is used for disk drives.
Figure 9:
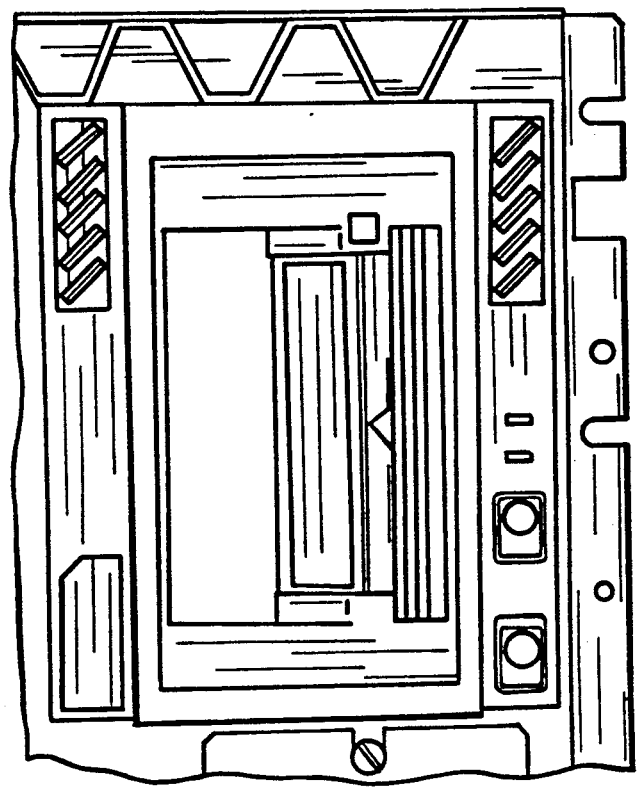
FIG. 9 is a front view of a cover of the assembly which is used for tape drives.

The frame means also includes front cover 32 which is spaced from back portion 44 and is fixedly attached to the front of computer cabinet 20 by screwing cover screw 46, shown in FIG. 8, into correspondingly aligned, threaded cover cabinet hole 50, shown in FIG. 4A. In an alternate preferred embodiment, cover 32 may be attached to top or bottom frame members 40, 42, or both. In addition, although cover 32 is made of plastic, it can be plated with metal for the purpose of containing the radiation of electronic noise resulting from the operation of the storage device. In addition, cover 32 contains conductive, frequency clips 33a, 33b, 33c, 33d which make physical contact with the metal frame of computer cabinet 20 when cover 32 is installed and thereby ground assembly 30 for noise containment purposes.

Frame members 40, 42 define an interior support space 41 in which a storage device, generally designated 28, may be mounted. When fully assembled, assembly 30 has a generally box-like shape and frame members 40, 42 together with storage device 28 will form a generally rigid framework.

Figure 5:
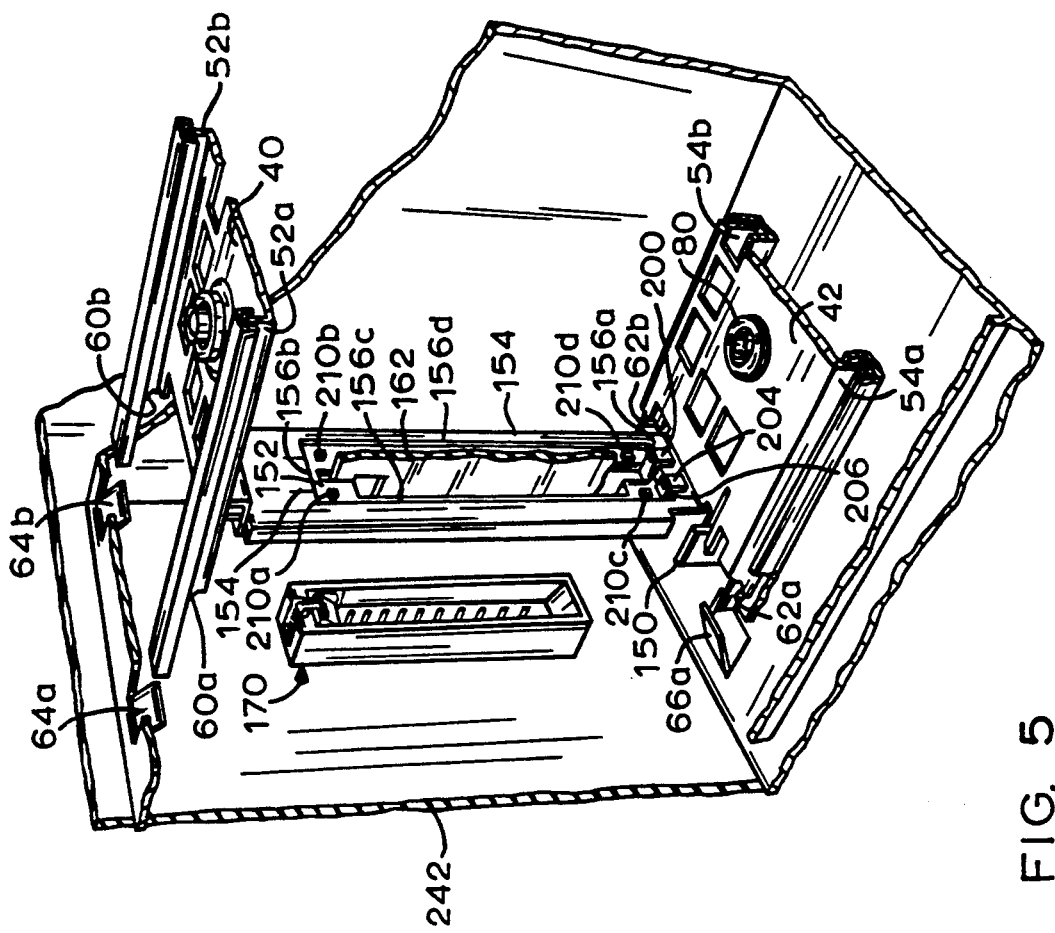
FIG. 5 is a perspective, partial sectional view of the interior, rearward end of the frame members and connector assembly mounted within the computer cabinet without any hardware module.
Figure 6:
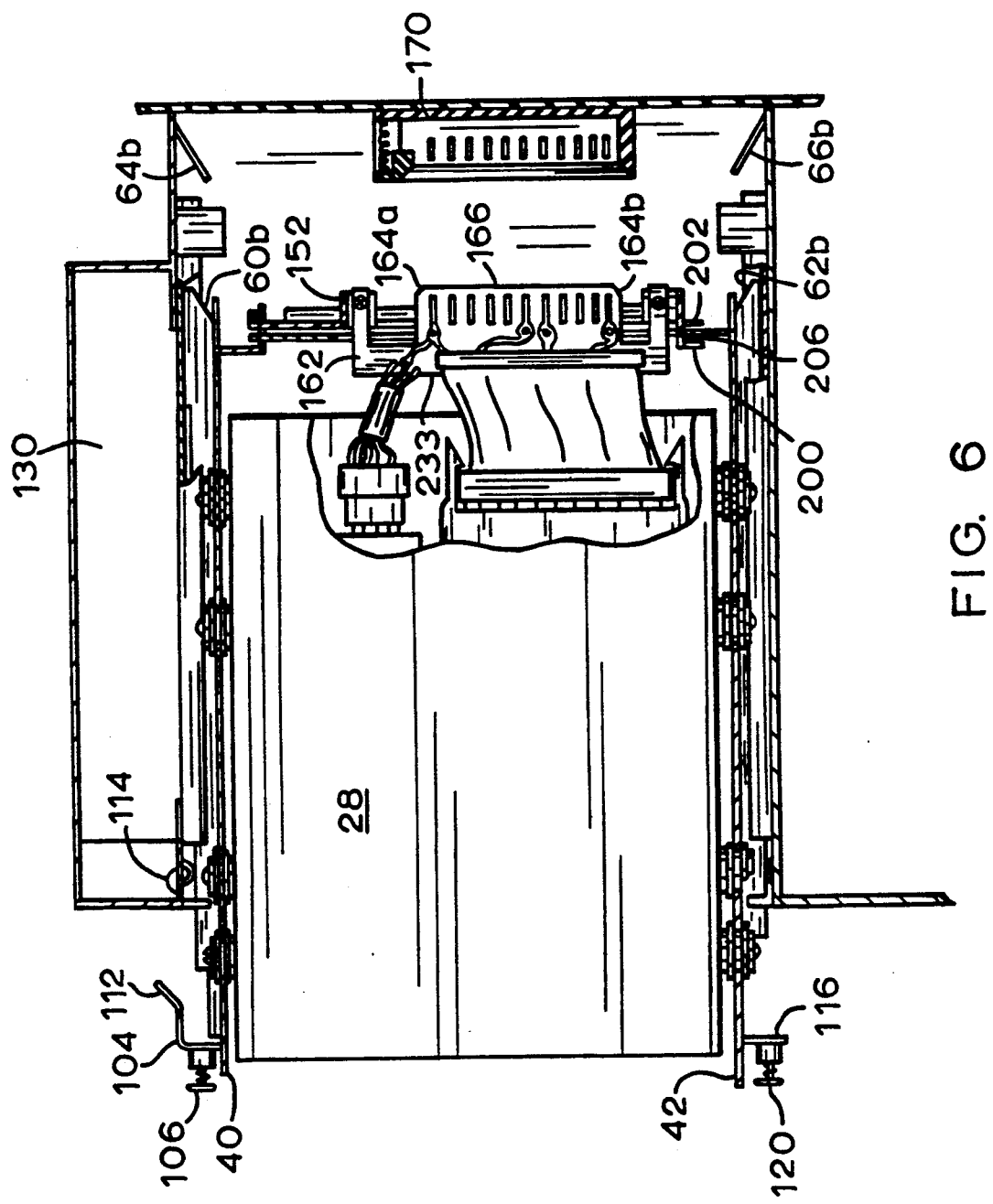
FIG. 6 is a partially broken away, side elevational view of the frame members and connector assembly with a hardware module, as they are mounted within the computer cabinet in a disengaged position.

Frame members 40, 42, include guide means for sliding the frame members 40, 42 in and out of computer cabinet 20. In the preferred embodiment, this comprises guide rails 52a, 52b which are generally parallel with each other, and integrally formed with top frame member 40. As shown in FIGS. 2A, 2B, and 3, guide rails 52a, 52b are upwardly depending and generally perpendicular to the plane formed by top frame member 40. Similarly, guide rails 54a, 54b are also generally parallel with each other and are integrally formed with bottom frame member 42. Correspondingly, guide rails 54a, 54b are downwardly depending and generally perpendicular to the plane formed by bottom frame member 42. The rearward section of guide rails 52a, 52b, 54a, 54b have beveled ends 60a, 60b, 62a, 62b, respectively. When frame members 40, 42 are fully inserted in computer cabinet 20, beveled ends 60a, 60b, 62a, 62b will come to rest against stop tabs 64a, 64b, 66a, 66b, respectively, as shown in FIGS. 5 and 6. Furthermore, the precise interaction of beveled ends 60a, 60b, 62a, 62b and stop tabs 64a, 64b, 66a, 66b is highly important in, assuring that assembly 30 is not inserted too far into the cavity 69 in computer cabinet 20 (as shown in FIG. 4A), the reason for which shall be detailed below.

Referring now to FIGS. 4A and 5, also included in the guide means are U-shaped rail channels 56a, 56b, 58a, 58b which are positioned inside computer cabinet 20. Rail channels 56a, 56b, 58a, 58b are dimensioned and configured such that guide rails 52a, 52b, 54a, 54b smoothly slide therein. In addition, FIG. 4A further shows grounding contacts 57a, 57b, 57c, 59a, 59b, 59c which serve to protect assembly 30 from a static electric charge as it is being inserted into computer cabinet 20. Specifically, during the sliding movement of assembly 30 into computer cabinet 20 guide rail 52a will be in physical contact with grounding contact 57a; guide rail 52b with 57b; guide rail 54a with 59a; and guide rail 54b with 59b. Therefore, if any static electric charge is developed while guide rails 52a, 52b, 54a, 54b slidingly move in rail channels 56a, 56b, 58a, 58b it is discharged through grounding contacts 57a, 57b, 59a, 59b.

Figure 4B:
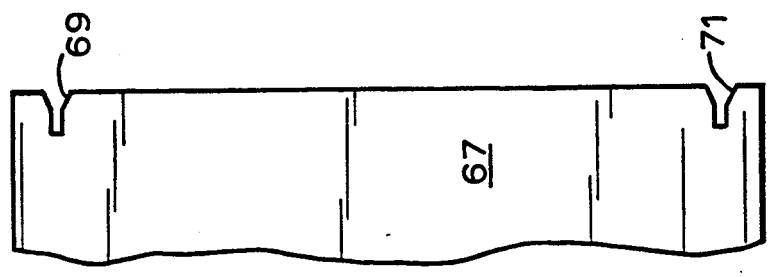
FIG. 4B is a partial, side view of the right wall of the cavity shown in FIG. 4A.

As shown in FIGS. 2A, 2B, and 3, top frame member 40 has top frame fin 63 projecting orthogonally outward from the foreward end of guide rail 52b, while bottom frame member 42 has a corresponding bottom frame fin 65 similarly projecting orthogonally outward from the foreward end of guide rail 54b. Referring again to FIG. 4A, the cavity in computer cabinet 20 in which assembly 30 is inserted is formed by rigid, sheet metal walls which form a substantially box-like enclosure. The right most wall of the enclosure, cavity wall 67, which is shown in enhanced detail in FIG. 4B, has top alignment slot 69 and bottom alignment slot 71, both of which have a ramped opening. These alignment slots are matingly configured and positioned to work in registration with top frame fin 63 and bottom frame fin 65, respectively, such that when assembly 30 is inserted into computer cabinet 20 the mating engagement of top frame fin 63 with top alignment slot 69, and bottom frame fin 65 with bottom alignment slot 71 will straighten and secure assembly 30.

As shown in FIG. 3, top and bottom frame members 40, 42 each has generally identical grounding straps 70a, 70b, respectively, and generally identical grounding strap apertures 72a, 72b, respectively. In addition grounding straps 70a, 70b each has a generally identical strap hole therethrough respectively; however, only strap hole 74b can be seen in the drawing.

In addition, top and bottom frame members 40, 42 include shock absorbing means connected to the frame members for minimizing the effects of shock and vibration on storage device 28. In the preferred embodiment, top and bottom frame members 40, 42 have a plurality of spaced, generally identical grommet holes 76, 78, respectively, for receiving therein flexible, rubber-like grommets 80, 82, respectively. Preferably, the grommets 80, 82, which have grommet sleeves 84, 86, respectively, disposed through their centers, are formed of elastomeric material sufficient to support the weight of the storage device 28, and the durometric characteristics of the material selected avoids amplification of the frequencies at which the storage device 28 may be susceptible to vibration.

Figure 7:
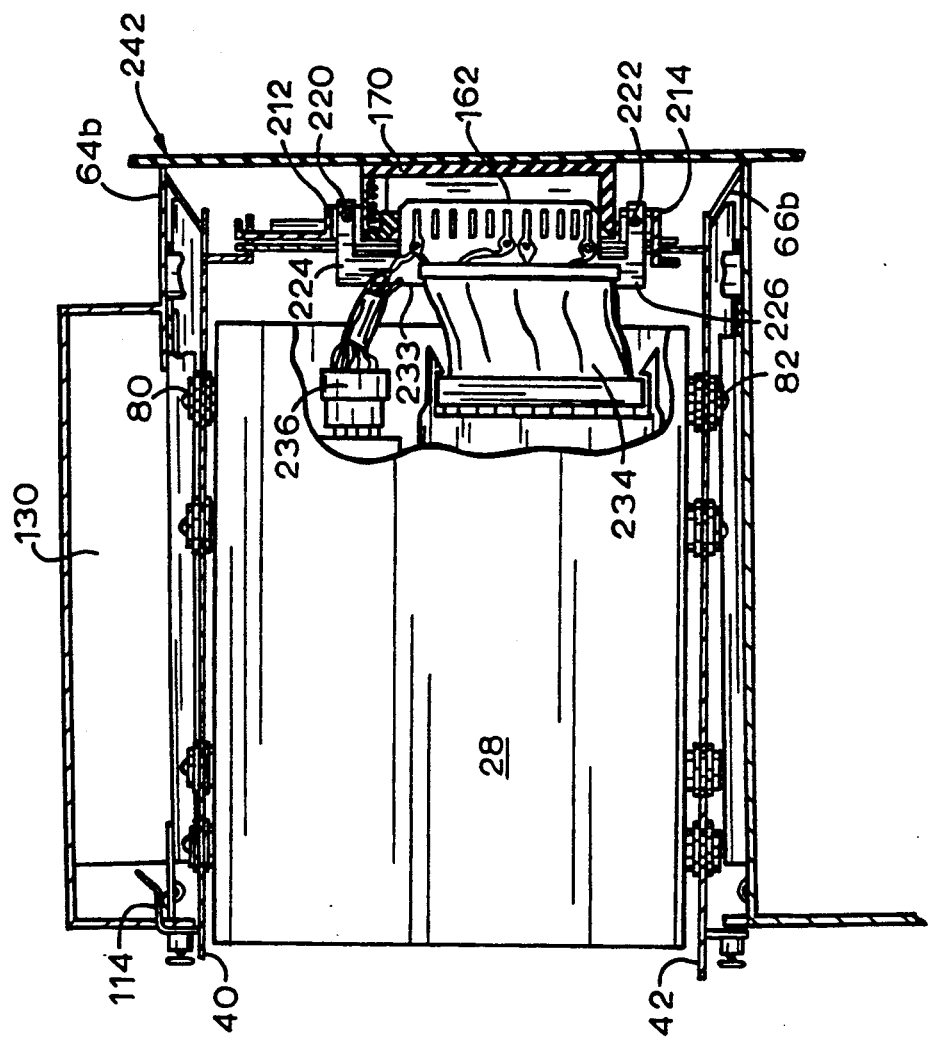
FIG. 7 is the same view as FIG. 6; however, it shows the frame members inserted far enough into the computer cabinet for the connector assembly to be in an engaged position.

Respectively, grommets 80, 82 have grooves 90, 92 extending around their circumferences, and grooves 90, 92 are aligned with and dimensioned for mating insertion into the rigid perimeter of grommet holes 76, 78 so that grommets 80, 82 are securely mounted therein. A portion of grommets 80, 82 are interposed between the top and bottom frame members 40, 42, respectively, and the storage device 28 as shown in FIG. 7. Any number of grommet holes 76, 78 and grommets 80, 82 may extend along top and bottom frame members 40, 42 to secure the storage device 28. Also, grommets of varying size may be used in order to accommodate storage devices of differing sizes.

As shown in FIG. 3, the secure attachment of grommets 80, 82, frame members 40, 42, and storage device 28 is through the use of a fastening means, such as bolts 94, 96. In the preferred embodiment, grounding straps 70a, 70b pass through grounding strap apertures 72a, 72b and are positioned between grommets 80, 82 and storage device 28. Thus, for secure attachment, bolts 94, 96 pass through grommet sleeves 84, 86 and strap holes 74a, 74b in grounding straps 70a, 70b and screw directly into storage device holes in storage device 28; however, only storage device holes 100 can be seen in the drawing. As a result, if the top frame member 40, alone, was being held with a storage device mounted therein, and the weight of the device caused the grommets 80 to be pulled through their respective grommet holes 76, the device would still be fixedly attached to the top frame member 40 through grounding strap 70a.

Referring now to FIG. 6, top frame member 40 has top screw flange 104, which is integrally formed with and upwardly projecting from the forward end of top frame member 40, and which has top screw 106, which is a "captive screw", attached thereto. Top screw 106 projects out of the back side of top screw flange 104 and can be, screwed into threaded, top cabinet hole 110, shown in FIG. 4A, computer cabinet 20 when frame members 40, 42 are fully inserted. Top frame member 40 is thereby secured to the computer cabinet 20 through top screw 106. Top screw flange 104 further has tang 112 which projects rearwardly and is angled upwardly at its end. As frame members 40, 42 are slid into computer cabinet 20, tang 112 will engage and slide up and over alignment detent 114, and thereby have a tendency to urge the forward end of top frame member 40 upward.

As can be seen from FIGS. 2A, 2B, and 3, top screw flange 104, which includes tang 112, is off center. Therefore, when storage device 28 is bolted to top and bottom frame members 40, 42 and they are inserted into computer cabinet 20 such that tang 112 slides over alignment detent 114, top and bottom frame members 40, 42 will have a tendency to pivot around alignment detent 114 and bend in toward storage device 28. This pivoting tendency is counteracted by the engagement of top frame fin 63 with top alignment slot 69 and bottom frame fin 65 with bottom alignment slot 71, all of which has the effect of keeping top and bottom frame members 40, 42 straight and secure.

Referring to FIG. 6, bottom frame member 42 has bottom screw flange 116, which is integrally formed with and downwardly projecting from the forward end of bottom frame member 42. Screw flange 116 has bottom screw 120, which is also a "captive screw." Bottom screw 120 projects out of the rearward side of screw flange 116 and can be screwed into threaded, bottom cabinet hole 122, shown in FIG. 4A, in computer cabinet 20 when frame members 40, 42 are fully inserted. Bottom frame member 42 is thereby secured to the computer cabinet 20 through bottom screw 120.

The preferred embodiment of the present invention includes cooling means for ventilating and cooling storage device 28. Referring to FIGS. 2A, 2B, and 3, top and bottom frame members 40, 42 have a plurality of spaced, generally identical apertures 124, 126, respectively, which permit the flow of a cooling fluid, such as air, between the interior and exterior sides of the frame members 40, 42. As shown in FIGS. 3 and 8, cover 32 has ventilation louvers 38 which are disposed at a 45 degree angle relative to the sides of cover 32 and are aligned in rows. Louvers 38 are also angled upwardly on the inside to prevent visual access to the storage device 28.

Also included in the cooling means, computer cabinet 20 forms a substantially imperforate enclosure and contains dynamic, fluid circulation means for the purpose of cooling the storage device 28, as well as other modules therein contained. One such circulation means may be a fan (not shown) which draws air through the upper portion of computer cabinet 20 and which is mounted in fan tray 26, shown on FIG. 1. Also in the preferred embodiment, when assembly 30 is mounted, top frame member 40 is spaced at least several inches below the inside of the top of computer cabinet 20, creating upper cabinet cavity 130, shown in FIGS. 4A and 6, thus permitting fluid to flow above top frame member 40.

In operation the circulating fan creates a lower air pressure at the bottom of the computer cabinet 20. Air will generally be drawn through louvers 38 in cover 32 and apertures 124 in top frame member 40 past storage device 28 mounted within frame members 40, 42. Correspondingly, air is drawn out past storage device 28 through apertures 126 in bottom frame member 42. Thus, the assembly 30 provides ventilation means for storage device 28. Moreover, the size and orientation of the louvers 38 and apertures 124, 126 may be varied depending upon the ventilation requirements of the particular storage device.

The invention includes means for controlling and means for determining the operating status of storage device 28. Referring to FIGS. 3 and 8, cover 32 has cover openings 132a, 132b, 132c, and 132d through its front, and an interior recess 134 in which control card 36 is mounted. Control card 136 provides control and status indicator connections to the storage device 28 through control/status cable 140. In addition, control card 136 has control and status elements 36a, 36b, 36c, 36d mounted thereon which project through corresponding cover openings 132a, 132b, 132c, 132d when control card 36 is mounted in interior recess 134. Thus, control of and information regarding the operating status of storage device 28 is easily accessible even when the assembly 30 is fully mounted in computer cabinet 20.

The present invention also contains a self aligning connector means which includes top and bottom frame members 40, 42 having prealignment fingers 142, 44, respectively, shown on FIGS. 2A, 2B, and 3. When frame members 40, 42 are slid into computer cabinet 20, prealignment fingers 142, 144 will matingly engage prealignment fins 146, 150, respectively, shown on FIGS. 4A and 5 and thereby align frame members 40, 42 within computer cabinet 20 (only pre-alignment fin 150 is shown in FIG. 5).

Figure 14:
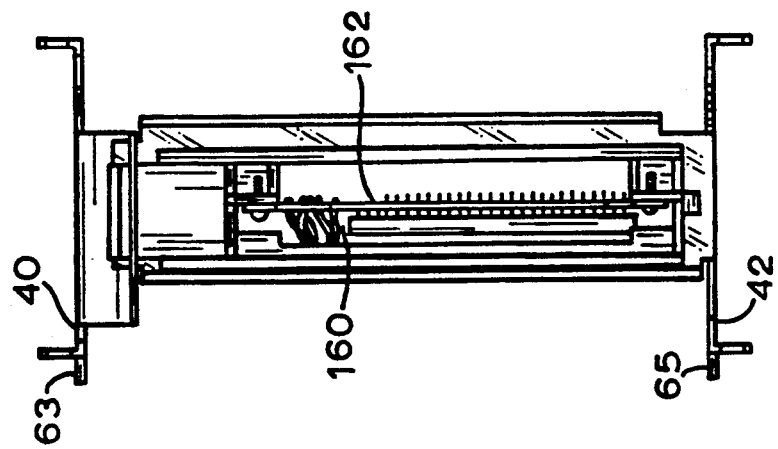
FIGS. 12-14 are rear views of the assembly without any hardware module, showing the bracket and circuit card mounted against the back portion of the bottom frame member, and also showing the bracket in a centered (FIG. 12), skewed (FIG. 13), and misaligned (FIG. 14) position.
Figure 13:
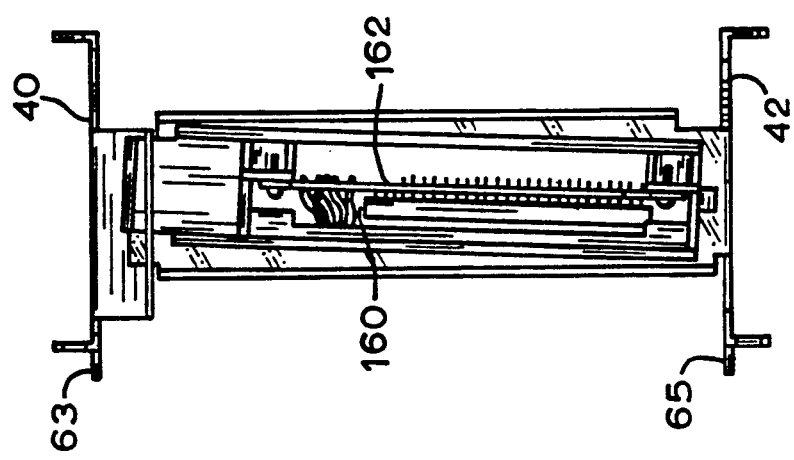

The self aligning connector means also includes bracket 152 slidably mounted on the rearward side of back portion 44, which has a back portion opening 154 having a lower opening edge 156a, an upper opening edge 156b, and two lateral opening edges 156c, 156d as shown in FIGS. 3 and 5. Bracket 152 similarly has bracket opening 160, shown in FIGS. 3 and 12-14, which substantially corresponds to and aligns with back portion opening 154. Additionally, circuit card 162 is removably, but rigidly, mounted on bracket 152, and circuit card 162 has two tapered corners, upper tapered corner 164a and lower tapered corner 164b, shown on FIGS. 6 and 10. Referring now to FIGS. 6 and 11, circuit card 162 also has a generally tapered edge 166, which extends along the rearward middle portion of circuit card 162. Tapered corners 164a, 164b, and tapered edge 166 can have a mechanically biasing effect on circuit card 162 as it is mated with backplane connector 170, shown in FIGS. 6 and 7, tending to center circuit card 162 as it enters backplane connector 170, even if it is at a skewed angle or misaligned, as shown in FIGS. 13 and 14.

Figure 10:
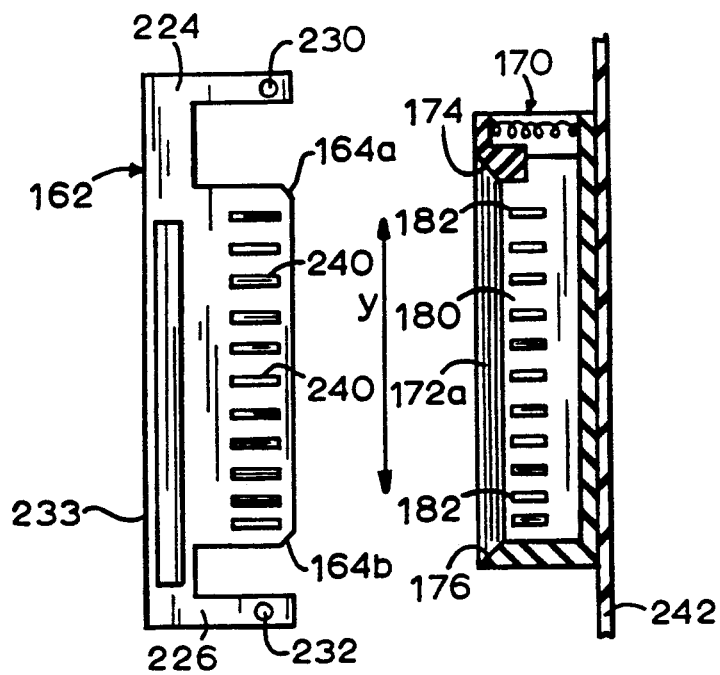
FIG. 10 is a side sectional view of the circuit card and connector, showing alignment of the connector elements along the vertical, or y-axis.
Figure 11:
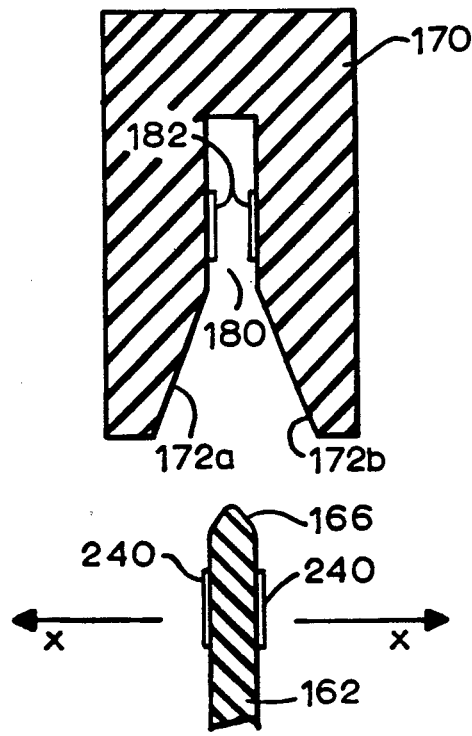
FIG. 11 is a cross sectional view of the circuit card and the backplane connector, the view showing alignment of the connector elements along the horizontal, or x-axis.

Referring to FIGS. 4A, 10 and 11, self aligning connector means further includes backplane connector 170 having inwardly ramped lateral sides 172a, 172b, inwardly ramped upper side 174, and inwardly ramped lower side 176, which generally define the outer perimeter of connector slot 180 inside of which a plurality of interior, generally parallel, linearly positioned, connector contacts, generally designated 182, are mounted, as shown on FIG. 10. Connector slot 180 is dimensioned and configured such that it will admit circuit card 162 into backplane connector 170, as shown on FIG. 7.

Figure 12:
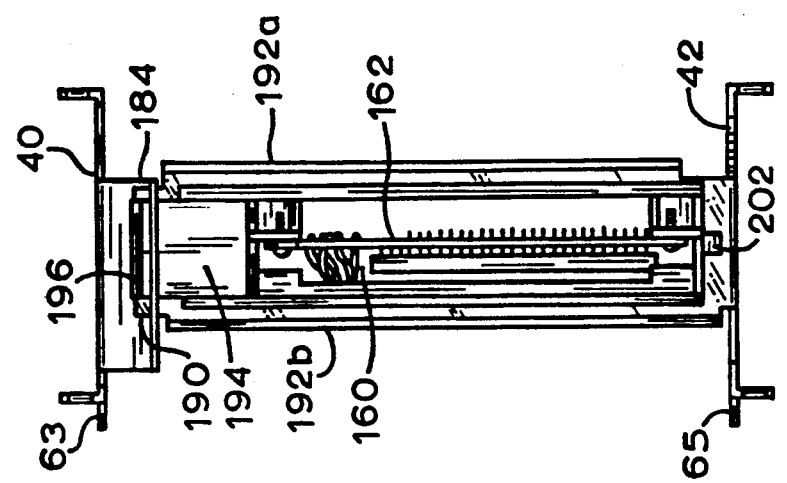

The preferred embodiment of the present invention includes retention means for preventing bracket 152 from separating from back portion 44. As shown on FIGS. 2A, 2B, and 3 the rearward section of top frame member 40 has a downwardly depending and angled retention flange 184, which has a retention aperture 186. The retention flange 184 and the retention aperture 186 are used for the purpose of connecting and securing top frame member 40 to back portion 44 and bracket 152. Back portion 44 has a back frame neck 190 which is dimensioned such that its width permits it to fit snugly inside retention aperture 186. Back portion 44 also has generally parallel, lateral shoulders 192a, 192b, which are integrally formed with back portion 44, and which extend wider than back frame neck 190, as shown in FIG. 12. Similarly, as shown in FIG. 3, bracket 152 has a bracket neck 194, which terminates at its upper end with a lip 196, and which is dimensioned such that it is narrower than retention aperture 186 and can thereby move, or "float" from side to side (x-axis movement), within retention aperture 186.

Referring now to FIGS. 5, 6, and 12, the retention means of the preferred embodiment further includes bracket 152 having three downwardly depending legs 200, 202, 204 at its bottom end. The two outer legs 200, 204 are L-shaped, both being molded at two 90 degree angles. The first angled portions of each extends to the forward end of assembly 30, and the length of each such portion is sufficient to traverse lower opening edge 156a. The second angled portions of outer legs 200, 204 extend downwardly from the first portions toward bottom frame member 42. The bottom side of the first angled portions of outer legs 200, 204 form stop edges 206.

When bracket 152 is mounted against back portion 44, top frame member 40 is non-fixedly connected together with back portion 44 and bracket 152 by admitting back frame neck 190 and bracket neck 194 through retention aperture 186. When frame members 40, 42 are assembled, but before they are inserted in computer cabinet 20, the bottom side of retention flange 184 will be supported by shoulders 192a, 192b of back portion 44. The depth of retention aperture 186 and the thickness of back portion 44 and bracket 152, together, are dimensioned such that retention aperture 186 secures, but does not unduly restrict the floating movement of bracket 152. Also, when assembled the first angled portion of outer feet 200, 204 will pass over the lower opening edge 156a and the second angled portion will be disposed against the lower, interior side of back portion 44, as shown in FIGS. 5 and 6. Inner leg 202, on the other hand, extends downwardly toward bottom frame member 42 and is disposed against the lower, exterior side of back portion 44, as shown in FIGS. 6 and 12.

The cooperative interaction of the legs 200, 202, 204 disposed on either side of the back portion 44 just below lower opening edge 156a, along with the retention of bracket neck 194 in retention aperture 186 prevents bracket 152 from detaching from back portion 44. Furthermore, legs 200, 202, 204 are spaced such that they do not snugly grip back portion 44, allowing the floating movement of bracket 152.

The preferred embodiment of the invention includes movement limitation means for restricting the floating movement of bracket 152 within certain predetermined tolerances. In particular, bracket 152 has four, generally identical, limitation pegs, two upper limitation pegs 210a, 210b and two lower limitation pegs 210c, 210d, mounted on its forward side, as shown in FIG. 5. When bracket 152 is mounted on back portion 44, limitation pegs 210a, 210b, 210c, 210d project through back portion opening 154. Limitation pegs 210a, 210b, 210c, 210d are spaced such that when bracket 152 is so mounted, bracket 152 is free to float within certain tolerances before such floating movement is impeded by: limitation peg 210a hitting against upper opening edge 156b or lateral opening edge 156c; limitation peg 210b hitting against upper opening edge 156b or lateral opening edge 156d; limitation peg 210c hitting against lateral opening edge 156c; limitation peg 210d hitting against lateral opening edge 156d; or stop edge 206 hitting against lower opening edge 156a. Other embodiments of the invention may include a lesser or greater number of limitation pegs working in registration with any number of openings to determine the extent of the movement of bracket 152.

The two upper limitation pegs 210a, 210b will determine the limit of the upward vertical (y-axis) and horizontal (x-axis) movement of bracket 152. The two lower limitation pegs 210c, 210d will also determine the limit the horizontal (x-axis) movement, while stop edge 206 will determine the limit of the downward vertical (y-axis) movement of bracket 152. Accordingly, when mounted, bracket 152 is free to float in the direction of either or both the x and y axis, including a skewed angle, which shall hereinafter be referred to as "multidirectional, planar movement." Thus, bracket 152 is capable of multidirectional, planar movement within the predetermined tolerances imposed by limitation pegs 210a, 210b, 210c, 210d, stop edge 206, and opening edges 156a, 156b, 156c, 156d.

Referring now to FIGS. 3, 7, and 10, the present invention includes an attachment means for fixedly mounting circuit card 162 on bracket 152. Bracket 152 has two, generally identical mounting braces, upper mounting define a plane which is substantially orthogonal to the plane defined by bracket 152 Each mounting brace 212, 214 has a corresponding mounting screw hole, upper mounting screw hole 216 and lower mounting screw hole 218 into which corresponding thread cutting, brace screws, upper brace screw 220 and lower brace screw 222, are screwed.

Additionally included in the attachment means, circuit card 162 has two, generally identical card shoulders, upper card shoulder 224 and lower card shoulder 226, which are formed as an integral part of circuit card 162, as shown in FIGS. 7 and 10. Card shoulders 224, 226 each have a shoulder hole, upper shoulder hole 230 and lower shoulder hole 232, which are large enough to permit corresponding brace screws 220, 222 to be admitted therethrough. Furthermore, shoulder holes 230, 232 are spaced and positioned such that they precisely align with corresponding mounting screw holes 216, 218.

Referring now to FIGS. 3 and 10, circuit card 162 is affixed to bracket 152 by mounting card shoulders 224, 226 against corresponding mounting braces 212, 214 such that corresponding mounting screw holes 216, 218 precisely align with corresponding shoulder holes 230, 232. Brace screws 220, 222 are then screwed through corresponding shoulder holes 230, 232 and screwed into corresponding mounting screw holes 216, 218, thereby fixedly mounting circuit card 162 to bracket 152 in such a way that the plane formed by circuit card 162 is generally orthogonal to the plane formed by bracket 152.

As a result of this fixed mounting arrangement, circuit card 162 is able to move according to the floating movement of bracket 152. Specifically, bracket 152 movably adjoins the rearward side of back portion 44 and is capable of multidirectional, planar movement within the predetermined tolerances established by limitation pegs 210a, 210b, 210c, 210d, stop edges 208, and the edges 156a, 156b, 156c, 156d of back portion opening 154, as explained above.

As shown in FIGS. 3 and 7, the forward edge 233 of circuit card 162 has power cable 234 and signal cable 236 fixedly mounted thereon. The other terminal points of power cable 234 and signal cable 236 are affixed to corresponding connector elements on the storage device 28. Accordingly, when circuit card 162 is mounted on bracket 152, as described above, circuit card 162 passes through bracket opening 160 and back portion opening 154, such that its forward edge, with its accompanying connections to power cable 234 and signal cable 236, are positioned on the interior side of frame members 40, 42. The rearward edge of circuit card 162 correspondingly projects out the external, rearward side of back portion 44.

As shown in FIG. 10, positioned between card shoulders 224, 226, the rearward edge of circuit card 162 has a plurality of generally parallel, linearly positioned, conductive card contacts, generally designated 240. Connector contacts 182 mounted in slot 180 of backplane connector 170 correspond to and matingly engage card contacts 240, and, when so engaged, they carry power and information signals between the storage device 28 and the backplane 242.

Assembly 30 containing storage device 28 is mounted within computer cabinet 20 as follows: frame members 40, 42 are slid into computer cabinet 10 along guide rails 52a, 52b, 54a, 54b, which are positioned in rail channels 56a, 56b, 58a, 58b, respectively. Any static charge built up by assembly 30 during its sliding insertion will be discharged through grounding contacts 57a, 57b, 59a, 59b. As frame members 40, 42 move toward their fully inserted position within computer cabinet 20, prealignment fingers 142, 144 will first engage their respective prealignment fins 146, 150 which will tend to center and align frame members 40, 42. Next, as frame members 40, 42 are further inserted, circuit card 162 engages backplane connector 170. Depending upon the orientation of circuit card 162 relative to backplane connector 170, tapered corners 164a, 164b and tapered edge 166 of circuit card 162 and inwardly ramped lateral, upper and lower sides 172a, 172b, 174, 176 of backplane connector 170 will cooperatively interact to center and align circuit card 162 within slot 180 as the two are pushed closer together, so that card contacts 240 will mate with connector contacts 182

As frame members 40, 42 are still further inserted, tang 112 will engage and slide over alignment detent 114. In the meanwhile, top frame fin 63 will engage and slide into top alignment slot 69 and bottom frame fin 65 will do the same with bottom alignment slot 71. Ultimately, beveled ends 60a, 60b, 62a, 62b will come to rest against stop tabs 64a, 64b, 66a, 66b, respectively. To tightly secure frame members 40, 42 in place top screw 106 is screwed into top cabinet hole 110 and bottom screw 120 is screwed into bottom cabinet hole 122. As can now be seen, the precise positioning and interaction of beveled ends 60a, 60b, 62a, 62b and stop tabs 64a, 64b, 66a, 66b is important for insuring that circuit card 162 is inserted far enough into slot 180 so that circuit card 162 engages backplane connector 170; however, the dimensioning and tolerances of beveled ends 60a, 60b, 62a, 62b and stop tabs 64a, 64b, 66a, 66b must be precise enough to insure that circuit card 162 is not inserted too far, which could damage circuit card 162 or backplane connector 170.

Finally, control/status cable 140 is connected to control card 136, and control card 136 is mounted into interior recess 134. Then, cover 32 is mounted in front of frame members 40, 42 by screwing cover screw 46 into cover cabinet hole 50.

Although the preferred embodiment has specifically referred to the mounting of a storage device, it will be readily seen by those skilled in the art that the integrated installation assembly may be applied to the slidable mounting of various hardware modules, including, but not limited to, tape drives, disk drives and power supplies. The present invention is applicable whenever the slidable mounting of a hardware module requires the employment of the blind mating technique. Also, depending upon the specific hardware module mounted in the integrated installation assembly, various control and status elements may be included on the front cover to control the hardware module and have access to its operating status.

Accordingly, the invention in its broader aspects is therefore not limited to the specific details, representative apparatus, and illustrative examples shown and described. Thus, departures may be made from such details without departing from the spirit or scope of the invention.

What is claimed is:

1. An assembly for mounting and electronically interconnecting a module within a computer cabinet having a connector mounted therein, said assembly comprising:
frame means for mounting a module with a computer cabinet, said frame means comprising a first and second frame member, said second frame member being substantially L-shaped having first and second angled portions, said first and second frame members being interconnected such that said first frame member is parallel to said first angled portion of said second frame member and together said first and second frame members define an interior space in which a module may be mounted;

guiding means positioned on said frame means for mounting said frame means into a computer cabinet; and a circuit card adapted for coupling with a module mounted in said frame means, said circuit card being capable of multidirectional, planar movement for adjusting the position of said circuit card when said frame means is inserted in the computer cabinet, so that said circuit card mates with the connector mounted in the computer cabinet.

2. The assembly defined in claim 1, wherein the computer cabinet has rail channels mounted therein, and said guiding means comprises guide rails positioned on the parallel portions of said first frame member and said first angled portion of said second frame member; said guide rails being configured and positioned such that said guide rails slide in the rail channels when said frame means is mounted in the computer cabinet.

3. The assembly defined in claim 1, wherein the computer cabinet has a prealignment fin mounted therein, and said assembly further comprises:

a prealignment finger positioned on said frame means, said prealignment finger being matingly configured and positioned to work in registration with the prealignment fin to align said frame means when said frame means is inserted in the computer cabinet;

a bracket which movably adjoins an exterior side of said second angled portion of said second frame member, said exterior side being the side of said second angled portion which is opposite from the side of said second angled portion defining said interior space, and said bracket having a bracket opening therethrough;

said second angled portion of said second frame member having a frame opening therethrough, said frame opening being generally aligned with said bracket opening; and said circuit card being attached to said bracket and positioned such that is passes through said frame opening and said bracket opening; said circuit card having a first and second edge, said first edge being adapted for coupling with a module and said second edge being dimensioned and configured such that said circuit card can be inserted into the connector mounted in the computer.

4. The assembly defined in claim 3, wherein said second edge of said circuit card is tappered and has a first and second tapered corner, whereby when said circuit card is moved toward the connector said tapered corners and said tapered edge center and align said circuit card with the connector so that said circuit card penetrates the connector.

5. The assembly defined in claim 3, further comprising attachment means for removably fastening said circuit card to said bracket, said attachment means comprising said bracket having at least one mounting brace and a fastening means such that said circuit card can be attached to said mounting brace by said fastening means.

6. The assembly defined in claim 3, further comprising: a cover which is in spaced relation to and positioned opposite from said second angled portion of said second frame member; a plurality of control elements which are mounted on said cover and which are adapted for coupling with a module mounted in said frame means, said control elements being adapted for controlling a module; and a plurality of light emitting diodes which are mounted on said cover and which are adapted for coupling with a module and for visually conveying information about the operating status of a module.

7. The assembly defined in claim 3, further comprising a cooling means, said cooling means being disposed through said frame means for cooling a module when it is mounted and operating in the computer cabinet.

8. The assembly defined in claim 7, wherein said cooling means comprises a cover which is in spaced relation to and positioned opposite from said second angled portion of said second frame member; said cover having a plurality of ventilation louvers, such that said louvers permit a cooling fluid to flow through said interior space.

9. The assembly defined in claim 7 or 8, wherein said cooling means comprises said frame members each having a plurality of apertures, said apertures being in spaced relation to each other and extending along each of said frame members such that they permit a cooling fluid to flow through said interior space.

10. The assembly defined in claim 3, further comprising shock absorbing means disposed between said frame means and a module when the module is mounted therein for protecting the module from shock and vibration.

11. The assembly defined in claim 10, wherein said shock absorbing means comprises: said first and second frame members each having a plurality of grommet holes therethrough, said grommet holes being in spaced relation to each other; and a plurality of grommets mounted in each such grommet hole, such that said grommets make physical contact with a module when the module is mounted in said frame members.

12. An assembly for mounting and electronically interconnecting a module within a computer cabinet having a connector mounted therein, said assembly comprising:

frame means for mounting a module within a computer cabinet, said frame means comprising a first and second frame member, said second frame member being substantially L-shaped having first and second angled portions, said first and second frame members being interconnected such that said first frame member is parallel to said first angled portion of said second frame member and together said first and second frame members define an interior space in which a module may be mounted;

guiding means positioned on said frame means for mounting said frame means into the computer cabinet;

a circuit card adapted for coupling with a module mounted in said frame means, said circuit card being capable of multidirectional, planar movement for adjusting the position of said circuit card when said frame means is inserted in the computer cabinet, so that said circuit card mates with the connector mounted in the computer cabinet;

cooling means disposed through said frame means for ventilating and cooling a module when the module is operated in the computer cabinet;

shock absorbing means disposed between said frame means and a module mounted therein, for protecting the module from shock and vibration during operation; and control means for controlling the operation of a module mounted in said frame means said control means being positioned on said frame means.

13. The assembly defined in claim 12, wherein the computer cabinet has rail channels mounted therein, and said guiding means comprises guide rails positioned on the parallel portions of said first frame member and said first angled portion of said second frame member; said guide rails being configured and positioned such that said guide rails slide in the rail channels when said frame means is inserted in the computer cabinet.

14. The assembly defined in claim 12, wherein the computer cabinet has a prealignment fin mounted therein, and said assembly further comprises:

a prealignment finger positioned on said frame means, said prealignment finger being matingly configured and positioned to work in registration with said prealignment fin to align said frame means when said frame means is inserted in the computer cabinet;

a bracket which movably adjoins an exterior side of said second angled portion of said second frame member, said exterior side being the side of said second angled portions which is opposite from the side of said second angled portion defining said interior space, and said bracket having a bracket opening therethrough;

said second angled portion of said second frame member having a frame opening therethrough, said frame opening being generally aligned with said bracket opening; and said circuit card being attached to said bracket and positioned such that is passes through said frame opening and said bracket opening; said circuit card having a first and second edge, said first edge being adapted for coupling with a module, and said second edge being dimensioned and configured such that said circuit card can be inserted into the connector mounted in the computer.

15. The assembly defined in claim 14, wherein said second edge of said circuit card is tappered and has a first and second tapered corner, whereby when said circuit card is removed toward the connector said tapered corners and said tapered edge center and align said circuit card with the connector so that said circuit card penetrates the connector.

16. The assembly defined in claim 14, wherein said bracket has a first and second end and at least one L-shaped leg depending from said first end, said leg being dimensioned and angled such that when said bracket is mounted against said exterior side of said second angled portion of said second frame member said leg passes through said frame opening and is disposed against the interior side of said second angled portion of said second frame member.

17. The assembly defined in claim 16, wherein said bracket has a bracket neck depending from said second end; and said first frame member has a retention aperture, which is dimensioned and configured such that when said bracket is mounted on said exterior side of said second angled portion of said second frame member and said first and second frame members are interconnected, said bracket neck passes through said retention aperture.

18. The assembly defined in claim 17, wherein said leg has a stop edge defined by the underside of that portion of said leg which passes through said frame opening; and said bracket has at least one limitation peg which works in registration with said frame opening, such that when said bracket is mounted against said exterior side of said second angled portion of said second frame member said limitation peg extends into said frame opening and said sliding, multidirectional, planar movement of said bracket is limited by the interception of the edge of said frame opening by said limitation peg, said stop edge, or both.

19. The assembly defined in claim 14, further comprising: a cover which is in spaced relation to and positioned opposite from said second angled portion of said second frame member; a plurality of control elements which are mounted on said cover and which are adapted for coupling with a module mounted in said frame means, said control elements being adapted for controlling a module; and a plurality of light emitting diodes which are mounted on said cover and which are adapted for coupling with a module and for visually conveying information about the operating status of a module.

20. The assembly defined in claim 12, wherein said cooling means comprises a cover which is in spaced relation to and positioned opposite from said second angled portion of said second frame member; said cover having a plurality of ventilation louvers, such that said louvers permit a cooling fluid to flow through said interior space.

21. The assembly defined in claim 12, wherein said cooling means comprises said frame members each having a plurality of apertures, said apertures being in spaced relation to each other and extending along each of said frame members such that they permit a cooling fluid to flow through said interior space.

22. The assembly defined in claim 21, wherein said cooling means further includes a means for circulating said cooling fluid.

23. The assembly defined in claim 22, wherein said means for circulating said cooling fluid includes a fan mounted within the computer cabinet.

24. The assembly defined in claim 23, wherein said cooling fluid is air.

25. The assembly defined in claim 12, wherein said shock absorbing means comprises: said first and second frame members each having a plurality of grommet holes therethrough, said grommet holes being in spaced relation to each other; and a plurality of grommets mounted in each such grommet hole, such that said grommets make physical contact with a module when the module is mounted in said frame members.

26. The assembly defined in claim 25, further comprising a plurality of bolts; said grommets each having a grommet sleeve disposed through its center; and a module having a plurality of module holes, said module holes being positioned and aligned with respect to said grommet sleeves so that when the module is mounted within said frame members said bolts can be screwed through said grommet sleeves and into the module holes to thereby secure said grommets between the module and said first and second frame members, and to further secure said first and second frame members to the module.

27. The assembly defined in claim 14, further comprising attachment means for removably fastening said circuit card to said bracket, said attachment means comprising said bracket having at least one mounting brace and a fastening means such that said circuit card can be attached to said mounting brace by said fastening means.

28. A computer cabinet, having an electrical backplane therein, for housing and electronically interconnecting a module to said cabinet through said backplane, said cabinet having a cavity, one side of said cavity being enclosed by said backplane, and said cabinet comprising:
  a connector mounted on said backplane such that said connector is within said cavity;
  frame means for mounting a module within said cabinet, said frame means comprising a first and second frame member, said second frame member being substantially L-shaped having first and second angled portions, said first and second frame members being interconnected such that said first frame member is parallel to said first angled portion of said second frame member and together said first and second frame members define an interior space in which a module may be mounted, and, when so mounted, said frame members and said module form a framework configured for insertion in said cavity;
  guiding means positioned on said frame means and said cabinet for slidably mounting said frame means into said cavity; and
  a circuit card adapted for coupling with a module mounted in said frame means, said circuit card being capable of multidirectional, planar movement for adjusting the position of said circuit card when said frame means is inserted in said cavity, so that said circuit card mates with said connector.

29. The cabinet defined in claim 28, wherein said guiding means further comprises: guide rails positioned on the parallel portions of said first frame member and said first angled portion of said second frame member, and rail channels positioned within said cavity; said guide rails being and said rail channels being matingly configured and positioned such that said guide rails slide in said rail channels when said frame means is inserted in said cavity.

30. The cabinet defined in claim 29, further comprising self aligning connector means, said self aligning connector means including:
  at least one prealignment fin mounted in said cabinet;
  at least one prealignment finger positioned on one of said frame members, said prealignment finger being matingly configured and positioned to work in registration with said prealignment fin to align said frame means when said frame means is inserted in said cabinet;
  a bracket which movably adjoins an exterior side of said second angled portion of said second frame member, said exterior side being the side of said second angled portion which is opposite from the side of said second angled portion defining said interior space, and said bracket having a bracket opening therethrough;
  said connector having a first and second end, said first end being mounted on said backplane, and said second end having a generally rectangular slot therein, defined by four inwardly ramped sides; and the interior of said slot having a plurality of linearly positioned, conductive connector contacts mounted therein, said connector contacts being electrically connected to said backplane;
  said second angled portion of said second frame member having a frame opening therethrough, said frame opening being generally aligned with said bracket opening; and
  said circuit card being attached to said bracket and positioned such that is passes through said frame opening and said bracket opening; said circuit card having a first and second edge, said first edge having a plurality of conductors mounted thereon through which said circuit card is adapted for coupling with a module, and said second edge having a plurality of linearly positioned, conductive card contacts which are electrically connected to said first edge conductors through said circuit card; and said circuit card being dimensioned and configured such that said circuit card can be inserted into said slot of said connector, and, when so inserted, said card contacts matingly engage said connector contacts.

31. An assembly for mounting and electronically coupling a module to a connector for coupling with a computer system, said assembly comprising:
  a frame for holding a module, said frame having a side member;
  a bracket mounted on said side member for multidirectional, planar movement thereon;
  a circuit card mounted on said bracket such that said multidirectional, planar movement of said bracket enables said circuit card to adjust its position during mounting to couple with the connector; and
  coupling means for electronically coupling said circuit card and a module, said coupling means being connectable to said circuit card and a module.

32. The assembly of claim 31, wherein said coupling means includes a power cable having a first and second end, said first end being coupled to said circuit card and said second end being adapted for connection to a connector on a module.

33. The assembly of claim 31, wherein said coupling means includes a signal cable having a first and second end, said first end being coupled to said circuit card and said second end being adapted for connection to a connector on a module.

34. The assembly of claim 31, wherein said bracket is slidably mounted on said side member.

35. The assembly of claim 31 further comprising shock absorbing means for protecting a module from shock and vibration, said shock absorbing means being disposed between said frame and the module when the module is held in said frame.

36. The assembly of claim 31, wherein the computer system includes a cabinet, and said assembly further comprises guiding means positioned on said frame so that said frame is adapted for slidably mounting in the cabinet.

37. The assembly of claim 36, wherein the cabinet has rail channels mounted therein, and said guiding means comprises guide rails positioned on said frame, said guide rails being configured such that they slide within the rail channels when said frame is inserted in the cabinet.

38. The assembly of claim 36, wherein the cabinet has a prealignment fin positioned on the cabinet, and said guiding means further comprises a prealignment finger positioned on said frame, said prealignment finger being matingly configured and positioned to work in registration with the prealignment fin to align said frame when said frame is inserted in the 39. An assembly for mounting and electronically coupling a module to a connector for coupling with a computer system, said assembly comprising:

a frame for holding a module, said frame having a side member which defines a plane;

a bracket movably mounted on said side member such that said bracket can move in the plane formed by said side member;

a circuit card mounted on said bracket such that said circuit card extends in a direction substantially perpendicular to the plane formed by said side member, the movement of said bracket enabling said circuit card to adjust its position during mounting to couple with the connector; and coupling means for electronically coupling said circuit card and a module held in said frame, said coupling means being connectable to said circuit card and a module.

40. The assembly of claim 39, wherein said side member has a side member opening therethrough, said bracket has a bracket opening therethrough which substantially aligns with said side member opening, and said circuit card is mounted on said bracket such that said circuit card extends through said bracket opening and through said side member opening and is substantially perpendicular to the plane formed by said side member.

41. The assembly of claim 39, wherein said coupling means includes a power cable having a first and second end, said first end being coupled to said circuit card and said second end being adapted for connection to a connector on a module.

42. The assembly of claim 39, wherein said coupling means includes a signal cable having a first and second end, said first end being coupled to said circuit card and said second end being adapted for connection to a connector on a module.

43. The assembly of claim 39, wherein said frame includes first and second frame members, said side member being integrally formed with said second frame member, and said first and second frame members and said side member being interconnected to form a three sided enclosure inside of which a module may be held.

44. The assembly of claim 43, further comprising shock absorbing means for protecting a module from shock and vibration, said shock absorbing means being disposed between said first and second frame members and the module when the module is held in said frame.

45. The assembly of claim 39, wherein the computer system includes a cabinet having rail channels mounted therein, and said assembly further comprises guide rails positioned on said first and second frame members, said guide rails being configured such that they slide within the rail channels when said frame is inserted in the cabinet.

46. A computer cabinet assembly comprising:

an enclosure having a cavity therein;

a backplane which forms one of the sides of said enclosure;

a connector mounted on said backplane;

a frame for holding a module, said frame having a side member and being adapted for mounting in said cavity;

a bracket mounted on said side member for multidirectional, planar movement thereon;

a circuit card mounted on said bracket such that said multidirectional, planar movement of said bracket enables said circuit card to adjust its position to couple with said connector when said frame is mounted in said cavity; and coupling means for electronically coupling said circuit card and a module held in said frame.

47. The cabinet assembly of claim 45, further comprising shock absorbing means for protecting a module from shock and vibration, said shock absorbing means being disposed between said frame and the module when the module is held in said frame.

48. The cabinet assembly of claim 46, wherein said shock absorbing means comprises a plurality of rubber like grommets mounted on said frame to make contact with a module when a module is held in said frame.

49. The cabinet assembly of claim 45, further comprising said cavity having rail channels positioned therein, and said frame having guide rails positioned thereon, said guide rails being configured such that they slide within said rail channels when said frame is inserted in said cavity.

50. The cabinet assembly of claim 45, further comprising said cavity having a prealignment fin positioned therein, and said frame having a prealignment finger positioned thereon, said prealignment finger being matingly configured and positioned to work in registration with said prealignment fin to align said frame when said frame is inserted in said cavity.

* * * * *